United States Patent [19]
Hormuth et al.

[11] Patent Number: 6,075,690
[45] Date of Patent: Jun. 13, 2000

[54] RELAY MULTIPLEXER SYSTEM AND METHOD FOR IMPROVED DEBOUNCE OF RELAYS

[75] Inventors: Robert W. Hormuth; Cory A. Runyan, both of Cedar Park; Brian M. Tyler, Austin; Scott B. Kovner, Cedar Park, all of Tex.

[73] Assignee: National Instruments Corporation, Austin, Tex.

[21] Appl. No.: 09/248,647

[22] Filed: Feb. 11, 1999

[51] Int. Cl.<sup>7</sup> ...................................................... H01H 47/00
[52] U.S. Cl. ........................ 361/166; 361/167; 361/170; 361/191; 307/115; 307/132 V
[58] Field of Search .................................... 361/170, 191, 361/192, 193, 166, 167; 307/113, 115, 132 E, 132 V

[56] References Cited

U.S. PATENT DOCUMENTS

| 3,866,092 | 2/1975 | Burns ............................................ 361/2 |
| 4,028,591 | 6/1977 | Kahn et al. ................................ 361/11 |
| 5,329,417 | 7/1994 | Kniepkamp et al. ..................... 361/185 |
| 5,673,165 | 9/1997 | Kuhn et al. ............................... 361/154 |

OTHER PUBLICATIONS

HP E1460A Relay Multiplexer User's Manual, Hewlett–Packard Corp., Nov. 1995.

*Primary Examiner*—Michael J. Sherry
*Attorney, Agent, or Firm*—Conley, Rose & Tayon P.C.; Jeffrey C. Hood; Louis H. Iselin

[57] ABSTRACT

A system and method for controlling relays. The method may comprise receiving one or more input commands for a plurality of relays, with the plurality of relays including a first relay, and a last relay, initiating actuation of the first relay after receiving the input relay commands, and initiating actuation of the last relay after initiating actuation of the first relay. Initiating actuation of the last relay does not wait for a debounce of the first relay. The method waits a debounce period after initiating actuation of the last relay. The debounce period operates to debounce the last relay and the first relay. One or more second relays may also be included in the debounce sequence. The relays may be latching or non-latching relays. The method may determine if another relay is required to be actuated after initiating actuation of each relay. One of the input commands may include a debounce mode input. A delayed debounce mode debounces the plurality of relays only after the last relay has been actuated. An immediate debounce mode debounces each relay immediately after the relay has been actuated. The system comprises one or more relay drivers coupled to relay control logic, with optional relays coupled therebetween. The relay control logic is operable to receive input commands for the relays, to initiate actuation of the relays without waiting for a debounce of the previous relay. The relay control logic waits a debounce period after initiating actuation of the last relay. The debounce period operates to debounce the last relay and the first and second relays.

13 Claims, 5 Drawing Sheets

RELAY MULTIPLEXER SYSTEM AND METHOD FOR IMPROVED DEBOUNCE OF RELAYS

BACKGROUND OF THE INVENTION

1. Field of the Invention

This invention relates to instrumentation systems, and more particularly to a system and method for controlling the operations of multiplexed relays.

2. Description of the Related Art

Relays are used in a number of different applications, such as instrumentation systems and process control. Relays may be electromechanical, electrical, or electronic in nature.

The operations of typical electromechanical relays are well known in the art. In short, a relay is an electrically activated mechanical switch. The relay is opened and/or closed by energizing an electromagnet to either attract or repel a metal contact on a movable strip of metal. The metal strip has mass and elasticity, i.e. springiness and flexibility. The relay is normally designed to open or close quickly, so there is little resistance to movement of the metal strip.

Due to the elasticity of the metal strip, when an open relay is closed, the contacts close and then mechanically bounce open and closed before settling. The metal strip may bounce off the contact several times. This effect is known as "contact bounce", and it may last from 10–50 ms. It is noted that bounce can occur on opening as well as closing of the relay. The result of bounce is the electrical signal through the relay (i.e. any mechanical switch) does not transition smoothly between the open circuit condition and the closed circuit condition. Spikes and transients propagate through the electrical circuit upon each opening and closing of the relay.

Difficulties may arise as bouncing typically occurs for milliseconds, while electronic devices respond to electrical signals within microseconds. As bouncing is a well-known problem, several means of solving the problem of bounce are known, referred to as debounce. Debounce methods are primarily performed either in hardware immediately following the relay or in software. Debouncing, or allowing the relay to finish bouncing, is important, since a signal will be degraded until the relay has been debounced.

In order to debounce a relay in hardware, a sharp high-low or low-high transition is usually generated immediately following actuation of the relay through, for example, a buffer switched through a charging R-C circuit. The R-C time constant must be longer than the bounce time, causing the delay in the signal to reach 100 ms or more. To debounce a relay in software, the software adds delays in the code to compensate for the debounce time, also adding to the delay in the signal. The software may also poll a hardware bit waiting for a debounce in the hardware.

Examples of electrical or electronic relays include field effect transistor (FET) switches and solid-state relays. Electronic relays must also "debounce", also called "settle", because there is a finite time required for the electronic relay to reach its fully open or fully closed state. An electrical signal does not propagate smoothly through an electronic relay until the electronic relay has "settled" into its fully open state. Likewise, electrical signals may be intermittent while the electronic relay "settles" into its fully closed state.

In instrumentation systems, a plurality of relays may be included to allow multiple instruments to feed into a centralized control system. Initialization or reset procedures for 16, 32, 64, or even more relays often require sizable periods of time, as each relay is tested for proper transition from open to closed and/or closed to open. In prior art systems, each relay is debounced during the initialization or reset procedures. During operation, each relay is again debounced during the data acquisition phase.

Therefore, a system and method are desired to speed up initialization, reset, and actuation of relays while still ensuring proper relay operation. The system and method should be general enough to include switching devices ranging from solid state devices to mechanical relays.

SUMMARY OF THE INVENTION

The present invention comprises a system and method for debouncing a plurality of relays. The method comprises, in one embodiment, receiving one or more input relay commands for a plurality of relays, the plurality of relays including a first relay and a last relay. The method initiates actuation of each of the plurality of relays from the first relay to the last relay in succession. After receiving the input relay commands, the method does not wait for a debounce period for any of the relays until the last relay. The method waits a debounce period only after initiating actuation of the last relay. This debounce period is sufficient to debounce the last relay as well as all previously actuated relays. This provides a more efficient way to debounce a plurality of relays.

In one embodiment, the plurality of relays includes a first relay, at least one second relay, and a last relay. The method initiates actuation of the first relay after receiving the input commands. The method then initiates actuation of the second relay after initiating actuation of the first relay. Initiating actuation of the at least one second relay does not wait for a debounce of the first relay. The method initiates actuation of the last relay after initiating actuation of the second relay. Initiating actuation of the last relay does not wait for a debounce of the second relay. The method waits a debounce period only after closing the last relay. The debounce period operates to debounce the last relay and the first and second relays.

In one embodiment, the relays are non-latching relays. In this embodiment, initiating actuation of the second relay does not wait for the completion of the actuation (i.e. closure) of the first relay, and initiating actuation of the last relay does not wait for the completion of the actuation of the second relay. In another embodiment, the relays are latching relays where completion of actuation will latch a relay. In this embodiment, the first relay is required to latch after initiating actuation of the first relay and before initiating actuation of the second relay. Likewise, the second relay is required to latch after initiating actuation of the second relay and before initiating actuation of the last relay. In this embodiment, the last relay latches after initiating actuation of the last relay, and the debounce period then occurs.

In one embodiment, after initiating actuation of a relay, the method determines if a subsequent relay is required to be actuated after initiating actuation of the relay. The method initiates actuation of the subsequent relay after initiating actuation of the first relay and after determining that the subsequent relay is required to be actuated. When the method determines that another relay is not required to be actuated, the method waits a debounce period. Thus, as described above, the method does not wait for a debounce period until after the last relay has been actuated. The debounce period operates to debounce the last relay as well as all previously actuated relays.

In still another embodiment, the method receives a debounce mode input command which enables operation of one aspect of the present invention. If the debounce mode input indicates a delayed debounce mode, the method initiates actuation of the desired relays without waiting for a debounce period until after the actuation of the last relay. If the debounce mode input indicates an immediate debounce mode, the method waits a debounce period after actuating each relay and before actuating subsequent relays.

According to one aspect of the present invention, the method is implemented by control logic coupled to the relays. Alternatively, the method is performed by a relay controller that controls respective relay drivers. Thus, a system is also contemplated, comprising in one embodiment, a plurality of relays and relay control logic coupled to the plurality of relays.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

For the purpose of this disclosure, the term "relay" is intended to represent any electromechanical, electrical or electronic switching mechanism. Relays are actuated from a first state to a second state. A relay may include more than two states. The states of the relay may be referred to as "open", "closed", "set", "reset", or other similar term. It is noted that some relays are transitioned from a first state to a second state, where the first state and the second state are identically open or closed, but in different circuits. It is also noted that different terminology is used in the art when referring to different types or classes of relays. The "actuation time" for a relay may be used to describe only the "latching time" of the relay or the "time for latching and debouncing". Latching time is also referred to as "switching time", while debounce time is also referred to as "settling time". Other similar terminology is also contemplated.

Figure 1:
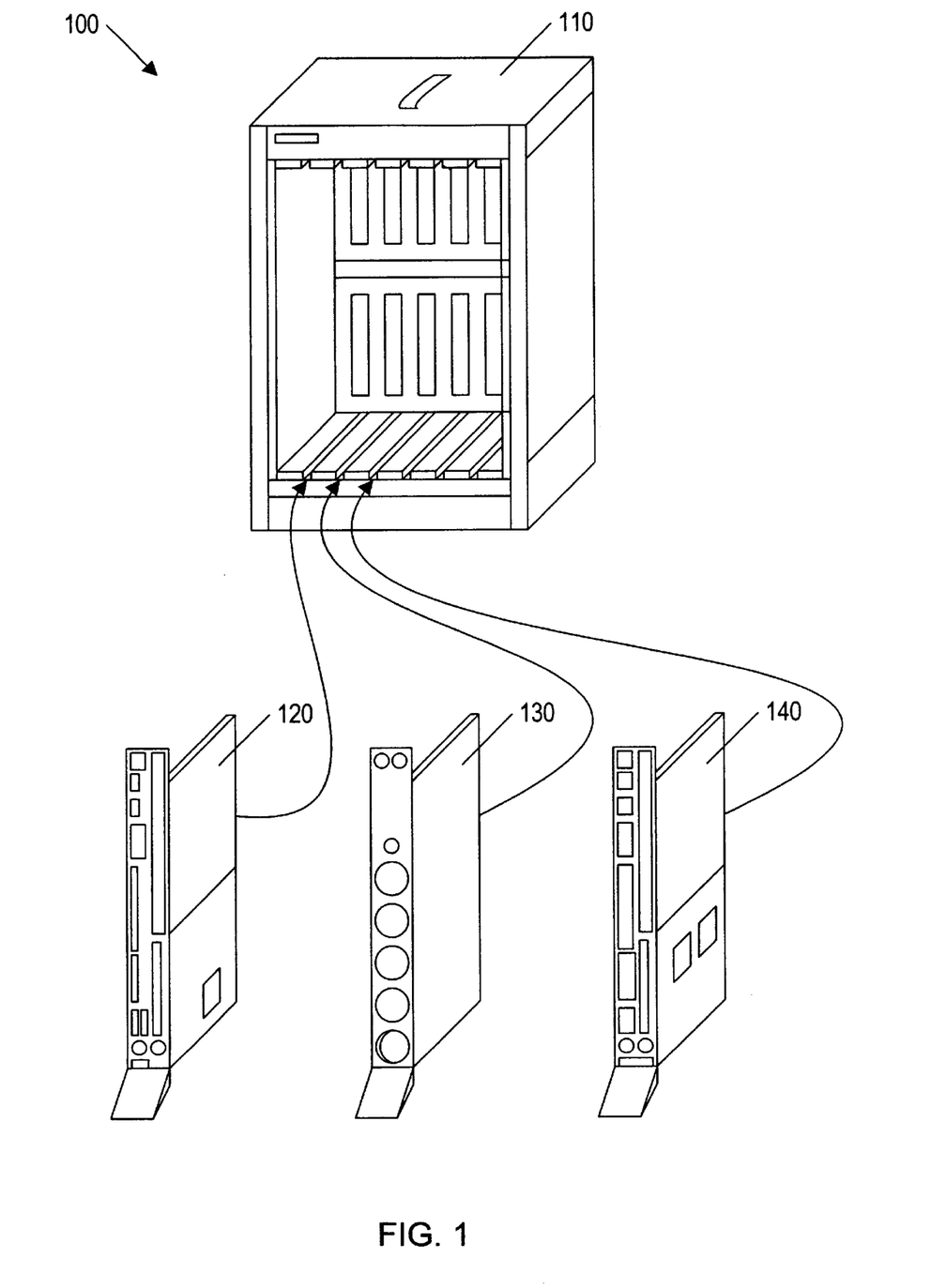
FIG. 1 is a block diagram of an embodiment of an instrumentation system including an instrumentation mainframe and add-in cards.

FIG. 1 illustrates an instrumentation system 100 incorporating the system and method of the present invention. As previously discussed, the present invention is preferably incorporated into an instrumentation system. However, it is noted that the present invention may be incorporated into other systems as desired. Also, the system in FIG. 1 is illustrative only, and it is noted that the present invention can be incorporated into various types of instrumentation systems, or other systems.

The instrumentation system 100 shown in FIG. 1 comprises a VXI mainframe 110 including an embedded CPU resource manager card 120 that controls VXI instruments, such as instrument card 130 and a relay multiplexer card 140, in the VXI mainframe 110 and may also control VXI instruments in another VXI mainframe (not shown), which may be coupled to the VXI mainframe 110. Additional VXI mainframes 110 may be daisy-chained together to allow the embedded CPU resource manager card 120 in the first VXI mainframe 110 to control any number of VXI instruments. The mainframe 110 may also comprise a PXI mainframe or other similar hardware.

An implementation of VXI mainframe 110 is the VXI-1200 FlexFrame, Part No. 777432-01, available from National Instruments, Austin, Tex. Other mainframes using other bus configurations are also contemplated. The embedded CPU card 120 may be implemented as a VXIpc-740 embedded VXI PC-compatible computer, available from National Instruments as Part No. 777330-21. Other embedded computers are also contemplated, as well as embedded controllers. It is contemplated that instrument card 130 may be any VXIbus compatible card.

Examples of the relay multiplexer card 140 include the following National Instruments products:

VXI-2727
 The VXI High Voltage Relay Multiplexer/Matrix includes a basic architecture of a 8 to 1 two wire multiplexer and then scales from that module. The unit comprises eight of these modules.

VXI-2701
 The VXI Low Voltage FET Multiplexer/Matrix includes a basic architecture of a 8 to 1 two wire multiplexer and then scales from that module. The unit comprises eight of these modules.

PXI-2503
 The PXI Low Voltage Relay Multiplexer/Matrix includes a basic architecture of a 6 to 1 two wire multiplexer and then scales from that module. The unit comprises four of these modules.

PXI-2527
 The PXI High Voltage Relay Multiplexer/Matrix includes a basic architecture of a 6 to 1 two wire multiplexer and then scale from that module. The unit comprises two of these modules.

PXI-2501
 The PXI Low Voltage FET Multiplexer/Matrix includes a basic architecture of a 6 to 1 two wire multiplexer and then scale from that module. The unit comprises four of these modules.

PXI-2565
 The PXI High Voltage High Current General Purpose Relay switch includes 16 1 Form A switches. These relays will be socketed, which requires a two-slot card.

In one alternative, an external computer (not shown) controls the VXI chassis. The external computer preferably comprises a system unit, monitor, keyboard, mouse, and expansion bus, preferably based on the peripheral component interconnect (PCI) bus. It is noted that other expansion buses may be used as desired. In this embodiment, the external computer controls the VXI mainframe 110 and the cards therein 130–140, instead of the embedded PC card 120. Serial interface cards, such as those which use the MXI bus, the USB bus, or the IEEE 1394 bus are well known in the art and will not be detailed herein.

Figure 2:
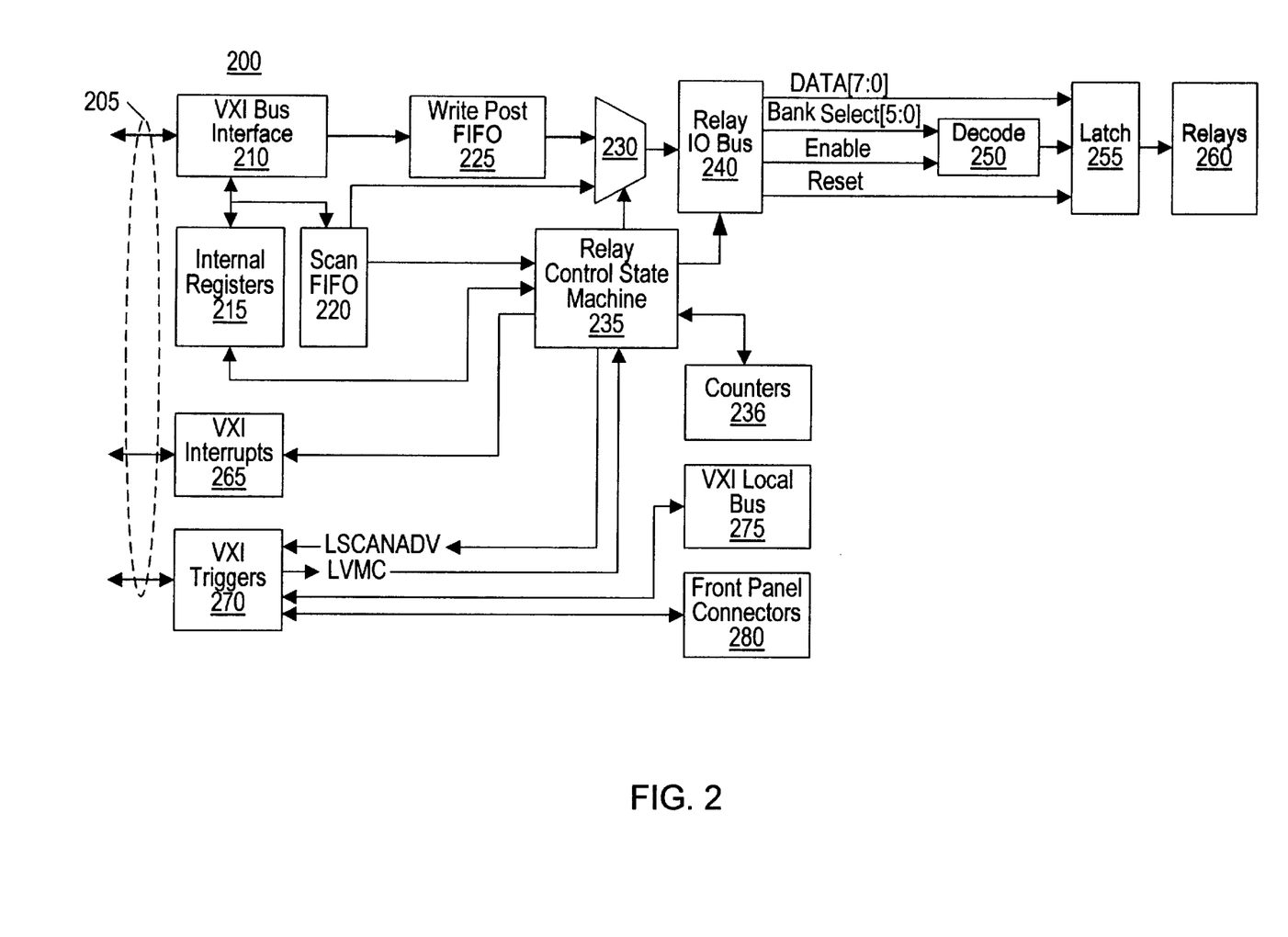
FIG. 2 is a block diagram representing an embodiment of an add-in card of FIG. 1 that includes a relay controller.

FIG. 2 illustrates a block diagram of the relay multiplexer controller 200. The backbone bus of the VXI mainframe 110 is shown as bus 205. In this embodiment, bus 205 is a VXI bus, although PXI, PCI, or other buses are contemplated. A VXI bus interface 210 couples to VXI bus 205, as well as to internal registers 215 and the write post FIFO 225. Relay commands are transferred across VXI bus 205, through the VXI bus interface 210, and then variously to write post FIFO 225, the internal registers 215, or the scan FIFO 220. Relay commands sent to write post FIFO 225 and scan FIFO 220 are later sent through multiplexer 230 to the relay input/output (I/O) bus 240. Relay commands in scan FIFO 220 may also be sent to the relay control logic, shown here as relay control state machine 235.

The relay control state machine 235 includes logic for controlling the relays using the debounce method of the present invention. The operation of the relay control state machine 235 of the present invention is discussed below with reference to FIG. 4. Relay commands may also be exchanged between the internal registers 215 and the relay control state machine 235. It is noted that control logic comprises one or more combinatorial logic circuits and/or state machines, which operate upon one or more input signals to produce one or more output control signals. These output control signals may be used to control various other devices.

Counters 236 are coupled to the relay control stay machine 235. The relay control state machine 235 uses the counters 236 to keep track of count up and countdown times for various relay commands, interrupts, etc. The relay control state machine 235 further routes various interrupts to a VXI interrupt unit 265. Relay control state machine 235 also sends and receives various trigger signals to and from a VXI trigger unit 270. VXI triggers are also exchanged between the VXI local bus 275 and the front panel connectors 280 and the VXI trigger unit 270. As shown, VXI trigger unit 270 sends the trigger input (LVMC) signal to the relay control state machine 235 and accepts the trigger output (LSCANADV) signal from the relay control stay machine 235. The LVMC signal may be input from a device external to the relay multiplexer controller 200. These are exemplary triggers only, and other trigger signals may be sent, either in combination with or in lieu of these signals.

Relay inputs and outputs sent to and from the relay I/O bus 240 may be routed over various ones of the following lines: data lines [7:0], bank select lines [5:0], enable, and reset. Data lines [7:0] couple to a latch unit 255, as does the reset line. Bank select lines [5:0] and the enable line coupled to a decode unit 250. Decode unit 250 also couples to the latch unit 255. Latch unit 255 couples to the relays 260, as shown. In various embodiments, latch unit 255 and the relay 260 may be unified, such as with the use of latching relays. It is noted that various ones of the triggers, interrupts, signals and relay commands are detailed below with respect to the embodiment of the relay control state machine 235 shown in FIG. 4.

Figure 3:
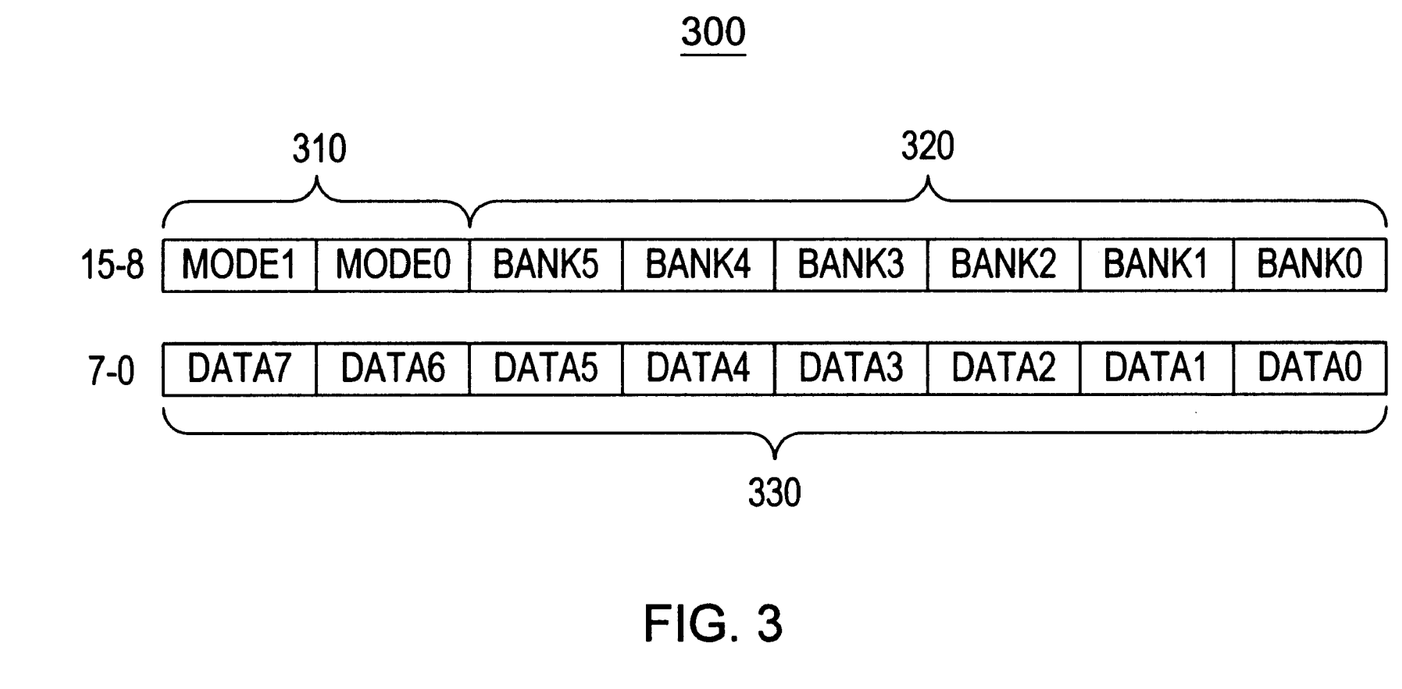
FIG. 3 is a block diagram of an embodiment of one set of registers included in FIG. 2.

FIG. 3 illustrates an embodiment of one of the internal registers 215 shown in FIG. 2, a relay set/clear register (RLYSCR) 300. The register 300 as shown includes 16 bits [15:0] and is used to write to the individual banks of relays 260. This format shown may be used in all modes of operation. The top two bits are the mode bits, MODE [1:0]. The mode bits are used to debounce and assert the trigger output (LSCANADV) signal. Debounce will generate an internal signal to start the de-bounce timer, preferably one of the counters 236. No writes to relay banks will be performed while the debounce timer is running. The trigger out can be routed to the VXI TTL triggers 270 and/or the front panel connectors 280. All modes enforce the actuation time required to energize the coils.

MODE[1:0]

00—do not wait for debounce before next relay bank write and do not assert LSCANADV 01—do not wait for debounce before next relay bank write and assert LSCANADV 10—wait for debounce before next relay bank write and do not assert LSCANADV 11—wait for debounce before next relay bank write and assert LSCANADV Bits 8–13 comprise the bank select bits BANK[5:0] 320. These bits 320 select one bank of relays (0 to 47), with each bank of relays comprising eight physical relays. The codes for 48–63 are reserved as special entries in the FIFO to indicate a command.

| |
|---|
| 0-RELAY 0–7 |
| 1-RELAY 8–15 |
| 2-RELAY 16–23 |
| 3-RELAY 24–31 |
| 4-RELAY 32–39 |
| 5-RELAY 40–47 |
| 6-RELAY 48–55 |
| 7-RELAY 56–63 |
| 8-RELAY 64–71 |
| 9-RELAY 72–79 |
| 10-RELAY 80–87 |
| 11-RELAY 88–95 |
| 12-RELAY 96–103 |
| 13-RELAY 104–111 |
| 14-RELAY 112–119 |
| 15-RELAY 120–127 |
| 16-RELAY 128–135 |
| 17-RELAY 136–143 |
| 18-RELAY 144–151 |
| 19-RELAY 152–159 |
| 20-RELAY 160–167 |
| 21-RELAY 168–175 |
| 22-RELAY 176–183 |
| 23-RELAY 184–191 |
| 24-RELAY 192–199 |
| 25-RELAY 200–207 |
| 26-RELAY 208–215 |
| 27-RELAY 216–223 |
| 28-RELAY 224–231 |
| 29-RELAY 232–239 |
| 30-RELAY 240–247 |
| 31-RELAY 248–255 |
| 32-RELAY 256–263 |
| 33-RELAY 264–271 |
| 34-RELAY 272–279 |
| 35-RELAY 280–287 |
| 36-RELAY 288–295 |
| 37-RELAY 296–303 |
| 38-RELAY 304–311 |
| 39-RELAY 312–319 |
| 40-RELAY 320–327 |
| 41-RELAY 328–335 |
| 42-RELAY 336–343 |
| 43-RELAY 344–351 |
| 44-RELAY 352–359 |
| 45-RELAY 360–367 |
| 46-RELAY 368–375 |
| 47-RELAY 376–383 |

If the top two bits of the BANK SELECT are "11", a command is indicated. The next three bits indicate the command, with the lowest bit being used in various commands for other meanings. Mode bits are ignored with most commands, with the exception of the reset relay commands.

NOP: b11000x: "No OPeration", used in multi-module scanning. The data portion plus the last bit of the BANK SELECT are then used to indicate the number of input trigger (VMCs) times to wait. The number of VMCs to wait for is from 1 to 512. When NOP is reached, the system waits one VMC plus the number of VMCs specified by the data before scanning continues. The input trigger that caused the NOP command to be reached does not count as one of the VMCs. The mode bits may be ignored with this command.

END SCAN: b11001x: "END of current SCAN", at this point the scan stops, an interrupt may be generated. The system then waits for next input trigger to continue.

END LIST: b11010x: "END of scan LIST", at this point the scan stops, an interrupt can be generated. END LIST will cause the SCAN_EN bit in the scan control (SCANC) REGISTER to be cleared and the FIFO counter to reset to zero when the CONTINOUS bit is cleared in the scan control register. To terminate a scan list, use an END SCAN followed by an END LIST. Doing this will allow the very last input trigger to move the FIFO off END SCAN, through END LIST, interrupt and start back at the beginning. If continuous mode scanning is enabled then the scanning continues processing data out of the FIFO.

BREAKPOINT: b11011x: Can be used to insert a breakpoint interrupt in the scan list. This allows an interrupt to be inserted anywhere in the scan list. Breakpoint will stop scanning by clearing the scan_en bit in the scan control register. To continue scanning the user will need to set the scan_en bit again.

RESET ALL RELAYS: b11111x: Can be used to reset all relays on the module. By default, this puts all the relays into their power-on state.

RESET ALL CHANNEL RELAYS: b11101x: Used to reset all channel relays on the module. By default, this puts all the channel relays into their power-on state.

RESET ALL CONFIG RELAYS: b11110x: Used to reset all configuration relays on the module. By default, this puts all the configuration relays into their power-on state.

NO RELAY ACTION: b11100x: Has no effect on relay states, however the actions indicated by the MODE bits will be carried out. When multiple cards are used, this can be used to create delays when break before make on the analog bus is needed.

The bottom eight bits are the data bits DATA[7:0] 330. The data bits 330 include the actual data to be written to the bank selected. Writing a one (1) will close the relay of the selected bank. Writing a zero (0) will open the relay of the selected bank.

Other registers in the system may include the relay timer control (RTCR) register and the actuate relay timer control (ARTCR) register. These registers store values used in timing the debouncing and latching (or closure) of a relay, respectively.

Figure 4:
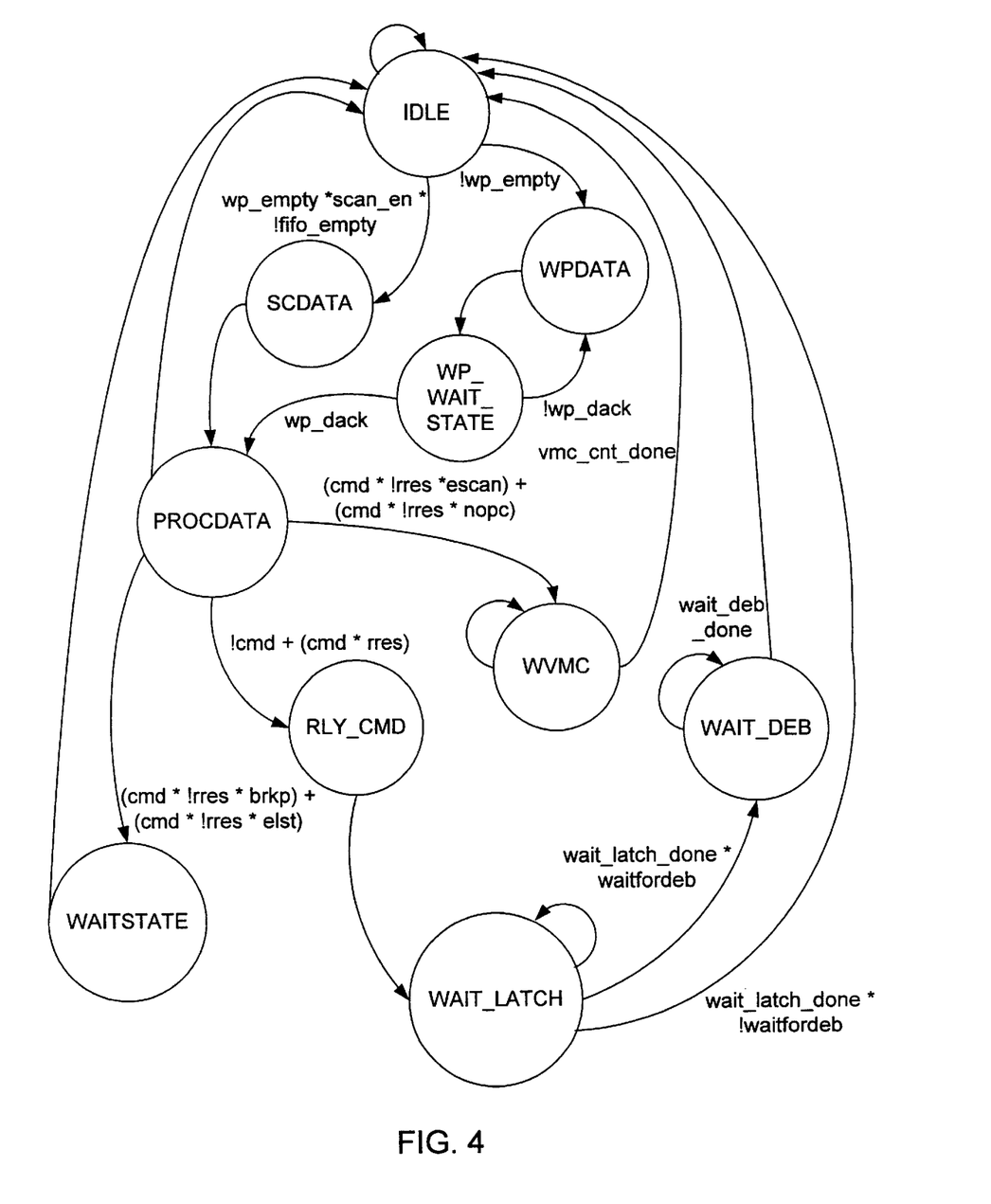
FIG. 4 is an embodiment of a state machine shown in FIG. 2 that controls the state of the relays.

FIG. 4—STATE MACHINE

As discussed above, the control logic is preferably implemented as relay control state machine 235. State machine 235 implements the debounce method of the present invention. FIG. 4 illustrates an embodiment of the state machine 235 and describes the operation of the state machine 235. In FIG. 4, the following signal definitions, conditions, and inputs are used:

Input Signals to State Machine

These signals are defined in the RLYSCR register described in FIG. 3.

| SIGNAL | DEFINITION | DESCRIPTION |
| --- | --- | --- |
| cmd = | BANK(5) * BANK(4); | the data in the register is a special command and not to actuate (open/close) a relay. |
| elst = | !BANK(1) * BANK(2); | an end list command should be generated |
| brkp = | BANK(1) * BANK(2) | a breakpoint should be generated |
| escan = | BANK(1) * !BANK(2); | an end scan command should be generated |
| nopc = | !BANK(1) * !BANK(2); | a NOP command should be generated, The number of input triggers to wait for is determined by DATA(7:0) and BANK(0); |
| waitfordeb = | MODE(1); | state machine should wait the debounce time before continuing on to the next command in the FIFO. |
| genscanadv = | MODE(0); | state machine should generate a trigger after the relay action is complete. |
| rres = | BANK(3); | the special command is to reset relays. If BANK(1) is set, all channel relays are opened, if BANK(2) is also set, all configuration relays are opened. |

Other Input Signals

| SIGNAL | DESCRIPTION |
| --- | --- |
| wp_empty | Signal from the write post (WP) FIFO to indicate if the WP FIFO is empty |
| scan_en | Signal from the scan control register, set to enable hardware scanning using the scan FIFO |
| continuous | Signal from the scan control register, determines if scanning |

-continued

| SIGNAL | DESCRIPTION |
|---|---|
| | should continuously loop through the scan list or execute the scan list just once |
| fifo_empty | Signal indicates that the scan FIFO is empty |
| wp_dack | Signal used to handshake with the WP FIFO since others, such as the bus interface can also be reading or writing to the FIFO |
| wait_deb_done | Signal from the debounce counter asserted when the count reaches the value set by the relay timer control (RTCR) register, giving the delay to allow the relay to settle before setting the output trigger (LSCANADV) or generating a debounced interrupt. |
| wait_latch_done | Signal from the debounce counter asserted when the count reaches the value set by the actuate relay timer control (ARTCR) register (or RTCR register if the value in the ARTCR register is greater than the value in the RTCR register). The ARTCR register gives the delay to allow the relay to latch (or close), upon actuation. |
| vmc_cnt_done | Signal from the "VMC trigger" counter. start_vmc_cnt starts the "vmc trigger" counter. The data is loaded with DATA(7:0) and BANK(0) when escan is not asserted and '0' when escan is asserted. The counter counts down. When the counter overflows the vmc_cnt_done signal is generated. |

Signals Generated Conditionally in the State Machine

| SIGNAL | ASSERTED ON "TRUE" |
|---|---|
| nFIFOR | WHEN SCDATA |
| rreq | WHEN WPDATA |
| nFIFORT | WHEN (WAITSTATE * elst) |
| breakpoint_t | WHEN (WAITSTATE * brkp) |
| scan_en_clr | WHEN ((WAITSTATE * elst * continuous) + (WAITSTATE * brkp)) |
| start_deb | WHEN RLY_CMD |
| endlist_t | WHEN (WVMC * elst) |
| endscan_t | WHEN (WVMC * escan) |
| scanadv | WHEN ((WAIT_LATCH * wait_latch_done * !waitfordeb * genscanadv) + (WAIT_DEB * wait_deb_done * gendscanadv)) |
| debounce_t | WHEN (WAIT_DEB * wait_deb_done) |

FIG. 4 is an embodiment of the state machine that illustrates operation according to one aspect of the present invention. Upon reset, the state machine begins in the IDLE state. When the write post FIFO empty (wp_empty) signal is FALSE, meaning that the write post buffer is not empty, the state machine advances to the WPDATA state. Thus when data is encountered in the WP FIFO, the state machine advances to the WPDATA state. In the WPDATA state, the read request (rreq) signal is asserted which operates to request data from the write post FIFO. The state machine then advances to the WP_WAIT_STATE state.

In the WP_WAIT_STATE state, the state machine is waiting for the write post data acknowledge (wp_dack) signal to be asserted. The write post data acknowledge signal is used to handshake with the write post FIFO to ensure that correct data is being read from the write post FIFO. As shown, as long as the write post data acknowledge signal is FALSE, the state machine loops between the WP_WAIT_STATE and the WPDATA states. When the write post data acknowledge signal is asserted, the state machine advances from the WP_WAIT_STATE to the PROC_DATA state.

In the IDLE state, when the write post empty signal is TRUE, the scan command register enable signal (scan_en) is TRUE, and the scan FIFO is not empty (!fifo_empty is TRUE), the state machine transitions to the SCDATA state. Thus when data is encountered in the scan FIFO and not in the WP FIFO, the state machine transitions to the SCDATA state as long as scanning as been enabled. The state machine next transitions from the SCDATA state to the PROC_DATA state.

In the PROC_DATA state, the state machine can advance to one of four states, these being the IDLE state, the WP_WAIT_STATE state, the RLY_CMD state, and the WVMC state. The system returns to the IDLE state unless one of the following conditions is TRUE. If one of the following conditions is TRUE, the system advances to a different state.

The state machine advances from the PROC_DATA state to the WAITSTATE state when the condition:

WHEN ((cmd*!rres*brkp)+(cmd*!rres*elst)).

is TRUE. The state machine advances from the PROCDATA state to the WAITSTATE when a special command (cmd) is encountered other than the relay reset command (rres), and either a request for a breakpoint (brkp) or an end list command (elst) is encountered. Breakpoints may be used for debugging a relay command setup. The end list command is generated when a scan list has been downloaded into the hardware.

The state machine transitions from the PROC_DATA state to the RLY_CMD state occurs when the condition:

!cmd+(cmd*rres)

is TRUE. The state machine advances from the PROCDATA state to the RLY_CMD state if no special command is encountered (!cmd) other than the relay reset command (rres). It is noted that the relay reset command is an example of a special command that involves a relay actuation. Most special commands typically do not involve relay actuation.

The state machine transitions from the PROC_DATA state to the WVMC state occurs when the condition:

WHEN(cmd*!rres*escan)+(cmd*!rres*nopc)

is TRUE. The state machine advances from the PROCDATA state to the WVMC state if a special command is encountered (cmd) that is not the relay reset command (rres) along with either a request to generate an end scan command (escan) or a NOP (nopc). The end scan command terminates scanning. The no operation command may be used with multiple relay modules. The relays on one module can be configured to wait for output triggers without actuation of the relays. Essentially, a NOP causes the state machine to wait for a predetermined number of time intervals before continuing.

In the WAITSTATE state, three signals can be generated, these being the nFIFORT signal, the breakpoint_t signal, and the scan_en_clr signal.

The nFIFORT signal is generated when the following condition is TRUE:

WHEN (WAITSTATE*elst).

In other words, the nFIFORT signal is generated when the state machine is in the WAITSTATE and bits 9 and 10 of the rly_datout register are 0 and 1 respectively, signaling a request for an end list command. The nFIFORT signal operates to resynchronize the scan FIFO, i.e., to reset the read pointer to zero, as preferably occurs after finishing a series of commands in the scan FIFO.

The breakpoint_t signal is generated when the following condition is TRUE:

WHEN (WAITSTATE*brkp).

This signal is the trigger to generate a "breakpoint" interrupt.

The scan_en_clr signal is generated when the condition:

WHEN ((WAITSTATE*elst*continuous)+ (WAITSTATE*brkp)

is TRUE. The scan_en_clr signal disables scanning through the scan FIFO for commands.

The state machine returns from the WAITSTATE state to the IDLE state on the next clock cycle.

In the WVMC state, two interrupts may be generated, these being the "end list" interrupt (endlist_t) and the "end scan" interrupt (endscan_t). The "end list" interrupt is generated if the following condition is true:

WHEN (WVMC*elst).

The "end scan" interrupt is generated if the following condition is true:

WHEN (WVMC*escan).

The state machine loops in the WVMC state until the vmc_cnt_done signal is TRUE. The vmc_cnt_done signal is the overflow signal on the "vmc trigger" counter, signifying that the counter has finished its countdown. When the vmc_cnt_done signal is TRUE, the state machine transitions to the IDLE state.

When the state machine enters the RLY_CMD state, a start_deb signal is activated which starts the debounce timer. The timer is loaded with the value in the RTCR register, described above. The state machine transitions from the RLY_CMD state to the WAIT_LATCH state.

The state machine loops in the WAIT_LATCH state until either of the two following is true:

WHEN (wait_latch_done*waitfordeb)
WHEN (wait_latch_done*!waitfordeb)

If the relay has latched (or closed in the case of a non-latching relay), that is, wait_latch_done is true, then the system transitions depending on the value of waitfordeb. If waitfordeb is true, meaning that an immediate debounce is requested, the system transitions to the WAIT_DEB state. In the WAIT_DEB state, the system waits for wait_deb_done to be true before transitioning to the IDLE state. If waitfordeb is false, meaning that a delayed debounce is requested according to the present invention, the system transitions to the IDLE state. When a plurality of relays are being actuated with a delayed debounce, all but the last relay will be actuated with !waitfordeb being true. The last relay will be actuated with waitfordeb being true, transitioning the system into the WAIT_DEB state for the debounce time. Thus, the relay controller can be configured to debounce only after the last of a plurality of relays has been actuated.

As discussed above, according to one aspect of the present invention, the state machine either waits for debounce after latching (or closing) a particular relay (the WAIT_DEB state), or the state machine transitions on the next relay without waiting for the debounce period (!waitfordeb).

It is noted that trigger signals may be generated or caused not to be generated through an input command. Thus, command sequences such as the following are contemplated:

Actuate Relay—wait for debounce—generate a trigger

Actuate—wait for debounce—do not generate a trigger

Actuate Relay—do not wait for debounce—do not generate a trigger

Actuate Relay—do not wait for debounce—generate a trigger

No Relay Action—wait for debounce—generate a trigger

No Relay Action—wait for debounce—do not generate a trigger

No Relay Action—do not wait for debounce—do not generate a trigger

No Relay Action—do not wait for debounce—generate a trigger

Wait for a trigger

NOP—wait for multiple triggers or trigger times to pass

Figure 5:
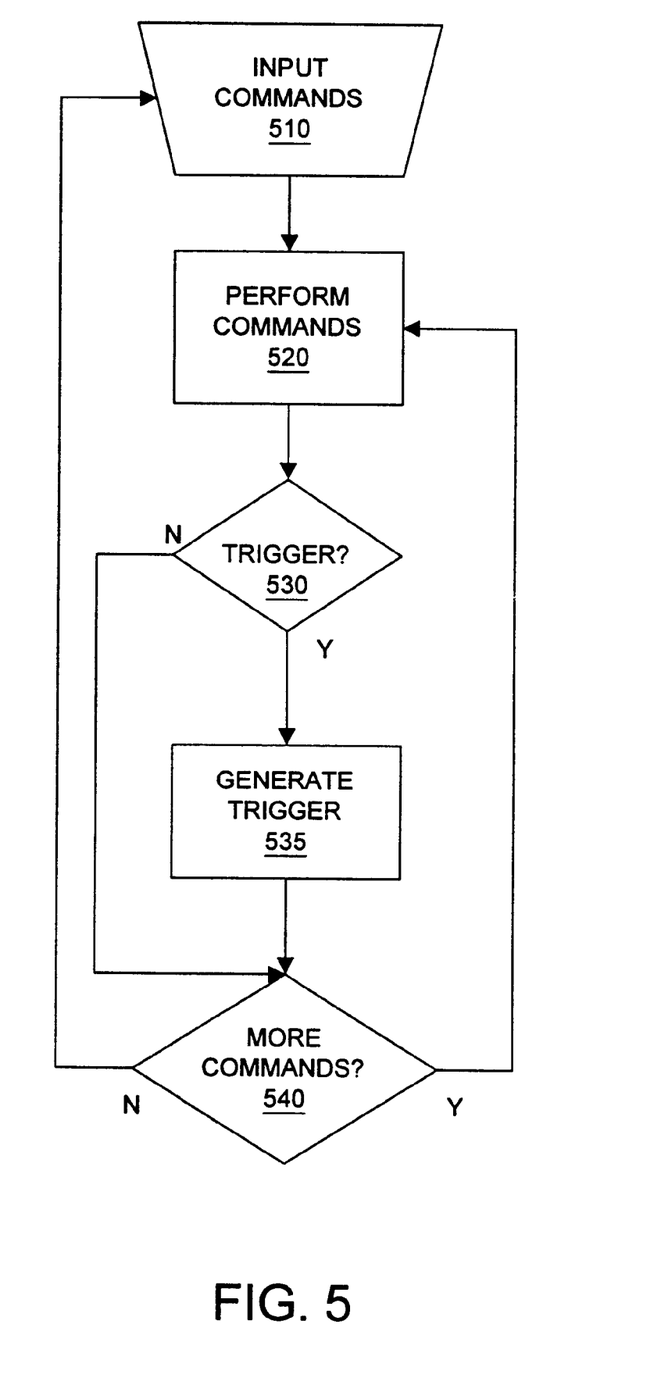
FIG. 5 is an embodiment of a method of operating the system of FIG. 1.

End scan list—read internal registers either to stop scanning or to scan continuously breakpoint—stop scanning and generate an interrupt FIG. 5 illustrates a flowchart of the operation of the system according to one aspect of the present invention. Commands are input to the system that includes the relay controller 200, in 510. These commands may include the delayed debounce method of the present invention. Inputting commands to the system preferably activates the state machine of FIG. 4. The relay controller performs various commands 520, such as practicing the present invention by delaying debouncing a plurality of relays until after the final relay has been actuated. The method checks for a request for trigger generation 530. If a trigger is to be generated, the trigger is generated at 535. If a trigger is not to be generated, the method checks for additional commands 540. If there are additional commands to be performed, the method returns to 520. If there are no more commands to be performed, the method returns to 510 to await the input of more commands.

It is noted that the method may be performed in a different order or with one or more parts left out. For example, the commands may be input at 510 one at a time or as a group. Thus the method may perform more than one command at 520, only one command may be performed at 520, or no commands may be performed at 520 if only a trigger is to be generated at 535.

Numerous variations and modifications will become apparent to those skilled in the art once the above disclosure is fully appreciated. It is intended that the following claims be interpreted to embrace all such variations and modifications.

What is claimed is:

1. A method for operating a plurality of relays, comprising:

receiving one or more input commands for a plurality of relays, wherein said plurality of relays includes a first relay, at least one second relay, and a last relay;

initiating actuation of the first relay after said receiving the one or more input commands;

initiating actuation of the second relay after said initiating actuation of the first relay, wherein said initiating actuation of the second relay does not wait for a debounce of the first relay;

initiating actuation of the last relay after said initiating actuation of the second relay, wherein said initiating actuation of the last relay does not wait for a debounce of the second relay;

wherein the method waits a debounce period after said closing the last relay, wherein said debounce period operates to debounce the last relay and the first and second relays.

2. The method of claim 1, wherein said plurality of relays are non-latching relays, wherein said initiating actuation of the second relay does not wait for the completion of the actuation of the first relay, and wherein said initiating actuation of the last relay does not wait for the completion of the actuation of the second relay.

3. The method of claim 1, wherein said plurality of relays are latching relays, wherein said first relay latches after said initiating actuation of the first relay and before said initiating actuation of the second relay, wherein said second relay latches after said initiating actuation of the second relay and before said initiating actuation of the last relay, and wherein said last relay latches after said initiating actuation of the last relay and before said debounce period after said initiating actuation of the last relay.

4. A method for operating a plurality of relays, comprising:
receiving one or more input commands for a plurality of relays, wherein said plurality of relays includes a first relay, at least one second relay, and a last relay;
initiating actuation of the first relay after receiving the one or more input commands;
determining if another relay is required to be actuated after said initiating actuation of the first relay;
initiating actuation of the second relay after said initiating actuation of the first relay and after said determining if another relay is required to be actuated after said first relay, wherein said initiating actuation of the second relay does not wait for a debounce of the first relay in response to determining that another relay is required to be actuated after said initiating actuation of the first relay;
determining if another relay is required to be actuated after said initiating actuation of the second relay;
initiating actuation of the last relay after initiating actuation of the second relay, wherein said initiating actuation of the last relay does not wait for a debounce of the second relay in response to determining that another relay is required to be actuated after said initiating actuation of the second relay;
determining if another relay is required to be actuated after said initiating actuation of the last relay, wherein the method waits a debounce period after said initiating actuation of the last relay in response to determining that another relay is not required to be actuated after said initiating actuation of the last relay, wherein said debounce period operates to debounce the last relay and the first and second relays.

5. A method for operating a plurality of relays, comprising:
receiving one or more input commands for a plurality of relays, wherein said plurality of relays includes a first relay, at least one second relay, and a last relay, wherein at least one of said input commands includes a debounce mode input;
wherein if said debounce mode input indicates a delayed debounce mode, the method further comprises:
initiating actuation of the first relay after said receiving the one or more input commands;
initiating actuation of the second relay after said initiating actuation of the first relay, wherein said initiating actuation of the second relay does not wait for a debounce of the first relay;
initiating actuation of the last relay after said initiating actuation of the second relay, wherein said initiating actuation of the last relay does not wait for a debounce of the second relay;
wherein the method waits a debounce period after initiating actuation of the last relay, wherein said debounce period operates to debounce the last relay and the first and second relays;
wherein if the relay command indicates an immediate debounce mode, the method further comprises:
actuating the first relay after said receiving the one or more input relay commands;
debouncing the first relay after said actuating the first relay;
actuating the second relay after said debouncing the first relay;
debouncing the second relay after said actuating the second relay;
actuating the last relay after said debouncing the second relay, and
debouncing the last relay after said actuating the last relay.

6. A relay control system, comprising:
a plurality of relays, wherein said plurality of relays includes a first relay, at least one second relay, and a last relay;
relay control logic coupled to the plurality of relays, wherein the relay control logic is operable to receive one or more input commands for the plurality of relays, wherein the relay control logic is operable to:
initiate actuation of the first relay;
initiate actuation of the second relay after initiating actuation of the first relay, wherein the relay control logic does not wait for a debounce of the first relay after initiating actuation of the first relay;
initiate actuation of the last relay after initiating actuation of the second relay, wherein the relay control logic does not wait for a debounce of the second relay;
wherein the relay control logic waits a debounce period after initiating actuation of the last relay, wherein said debounce period operates to debounce the last relay and the first and second relays.

7. The relay control system of claim 6, wherein said plurality of relays are non-latching relays, wherein said initiate actuation of the second relay does not wait for the completion of the actuation of the first relay, and wherein said initiate actuation of the last relay does not wait for the completion of the actuation of the second relay.

8. The relay control system of claim 6, wherein said plurality of relays are latching relays, wherein said first relay latches after said initiate actuation of the first relay and before said initiate actuation of the second relay, wherein said second relay latches after said initiate actuation of the second relay and before said initiate actuation of the last relay, and wherein said last relay latches after said initiate actuation of the last relay and before said debounce period after said initiate actuation of the last relay.

9. A relay control system, comprising:
one or more relay drivers configured to couple to a plurality of relays and to actuate said plurality of relays; and
a relay controller coupled to said one or more relay drivers, wherein said relay controller is configured to control said one or more relay drivers;
wherein said relay controller is coupled to accept a plurality of inputs, including:
a relay state input corresponding to a desired state for one or more of said plurality of relays; and a debounce input indicating a delayed debounce or an immediate debounce upon actuation of a relay by said one or more relay drivers;

wherein said relay controller is configured in response to receiving said relay state input to control said one or more relay drivers to actuate said one or more of said plurality of relays to said desired state;

wherein said relay controller is configured in response to receiving said debounce input indicating said delayed debounce to close all relays specified in said relay state input before waiting for a debounce of a last relay in said all relays; and wherein said relay controller is configured in response to receiving said debounce input indicating said an immediate debounce to wait for debounce after each relay specified in said relay state input is closed.

10. The relay control system of claim 9, further comprising:

said plurality of relays coupled to receive actuation from said one or more relay drivers.

11. The relay control system of claim 9, further comprising:

a plurality of latches coupled between said relay controller and said plurality of relays.

12. The relay control system of claim 9, wherein said plurality of inputs further include:

an actuation time input corresponding to a minimum period of time required for each of said plurality of relays to actuate; and a debounce time input corresponding to a period of time required for each of said plurality of relays to debounce;

wherein said relay controller is configured in response to receiving said actuation time input to wait said period of time required for each of said plurality of relays to actuate after said initiate actuation of each relay specified in said relay state input; and wherein said relay controller is configured in response to receiving said debounce time input to wait said period of time required for each of said plurality of relays to debounce, as configured by said debounce input.

13. A method for operating a plurality of relays, comprising:

receiving one or more input relay commands for a plurality of relays, wherein said plurality of relays includes a first relay, and a last relay;

initiating actuation of the first relay after receiving the one or more input relay commands;

initiating actuation of the last relay after said initiating actuation of the first relay, wherein said initiating actuation of the last relay does not wait for a debounce of the first relay;

wherein the method waits a debounce period after initiating actuation of the last relay, wherein said debounce period operates to debounce the last relay and the first relay.

* * * * *